United States Patent
Maeda

(10) Patent No.: US 7,609,123 B2
(45) Date of Patent: Oct. 27, 2009

(54) DIRECT MODULATION TYPE VOLTAGE-CONTROLLED OSCILLATOR USING MOS VARICAP

(75) Inventor: Masakatsu Maeda, Kyoto (JP)

(73) Assignee: Panasonic Corporation, Osaka (JP)

(*) Notice: Subject to any disclaimer, the term of this patent is extended or adjusted under 35 U.S.C. 154(b) by 59 days.

(21) Appl. No.: 11/953,345

(22) Filed: Dec. 10, 2007

(65) Prior Publication Data
US 2008/0150648 A1      Jun. 26, 2008

Related U.S. Application Data

(60) Provisional application No. 60/874,278, filed on Dec. 12, 2006.

(51) Int. Cl.
H03B 5/12      (2006.01)
H03C 3/22      (2006.01)
H03L 1/00      (2006.01)

(52) U.S. Cl. ............ 332/136; 331/117 FE; 331/177 V; 331/185; 331/186

(58) Field of Classification Search ............ 331/23, 331/36 C, 117 R, 117 FE, 117 D, 167, 168, 331/177 R, 177 V, 185, 186; 332/117, 127, 332/135, 136; 455/42, 110, 113
See application file for complete search history.

(56) References Cited

U.S. PATENT DOCUMENTS

| | | | | |
|---|---|---|---|---|
| 4,801,898 A | * | 1/1989 | Obayashi | 331/132 |
| 5,027,429 A | * | 6/1991 | Kojima | 455/113 |
| 2005/0231296 A1 | | 10/2005 | Souetinov et al. | |

FOREIGN PATENT DOCUMENTS

| | | |
|---|---|---|
| JP | 07-254818 | 10/1995 |
| JP | 2 005-253066 | 9/2005 |

OTHER PUBLICATIONS

Takashi Oshima and Masaru Kokubo, "Simple Polar-Loop Transmitter For Dual-Mode Bluetooth", Hitachi Ltd., Central Research Laboratory, pp. 3966-3969, 2005.

* cited by examiner

Primary Examiner—David Mis
(74) Attorney, Agent, or Firm—Wenderoth, Lind & Ponack, L.L.P.

(57) ABSTRACT

Transistors M11 and M12 are cross-coupled to each other so as to form a negative resistance circuit. First and second variable capacitor sections 10 and 20 are connected in parallel with an inductor circuit so as to form a parallel resonant circuit. A first reference voltage Vref1 and a control voltage VT1 corresponding to a carrier wave component are fed to both terminals, respectively, of each of variable capacitors VC11 and VC12 included in the first variable capacitor section 10. A second reference voltage Vref2 and a control voltage VT2 corresponding to a modulated wave component are fed to both terminals, respectively, of each of variable capacitors VC21 and VC22 included in the second variable capacitor section 20. A DC control section 30 includes a resistance R31 interposed between the second reference voltage Vref2 and a common connection point of resistances R21 and R22, and a capacitor C31 for feeding only an AC component included in the modulated wave component to the common connection point of the resistances R21 and R22. Thus, a DC voltage, on which the AC component included in the modulated wave component is superimposed, is changed from a certain DC bias to a DC bias of the second reference voltage Vref2.

6 Claims, 11 Drawing Sheets

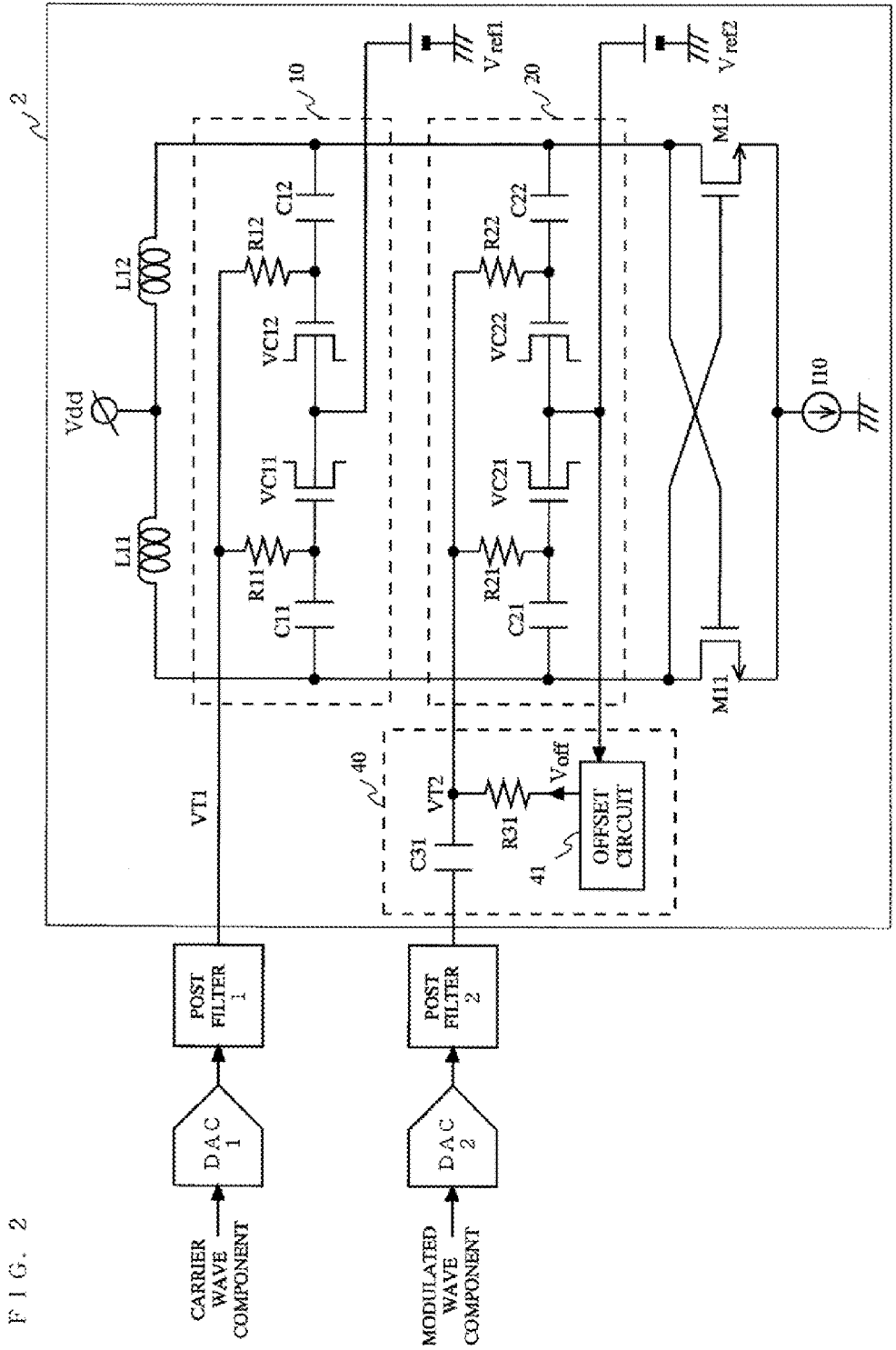
F I G. 2

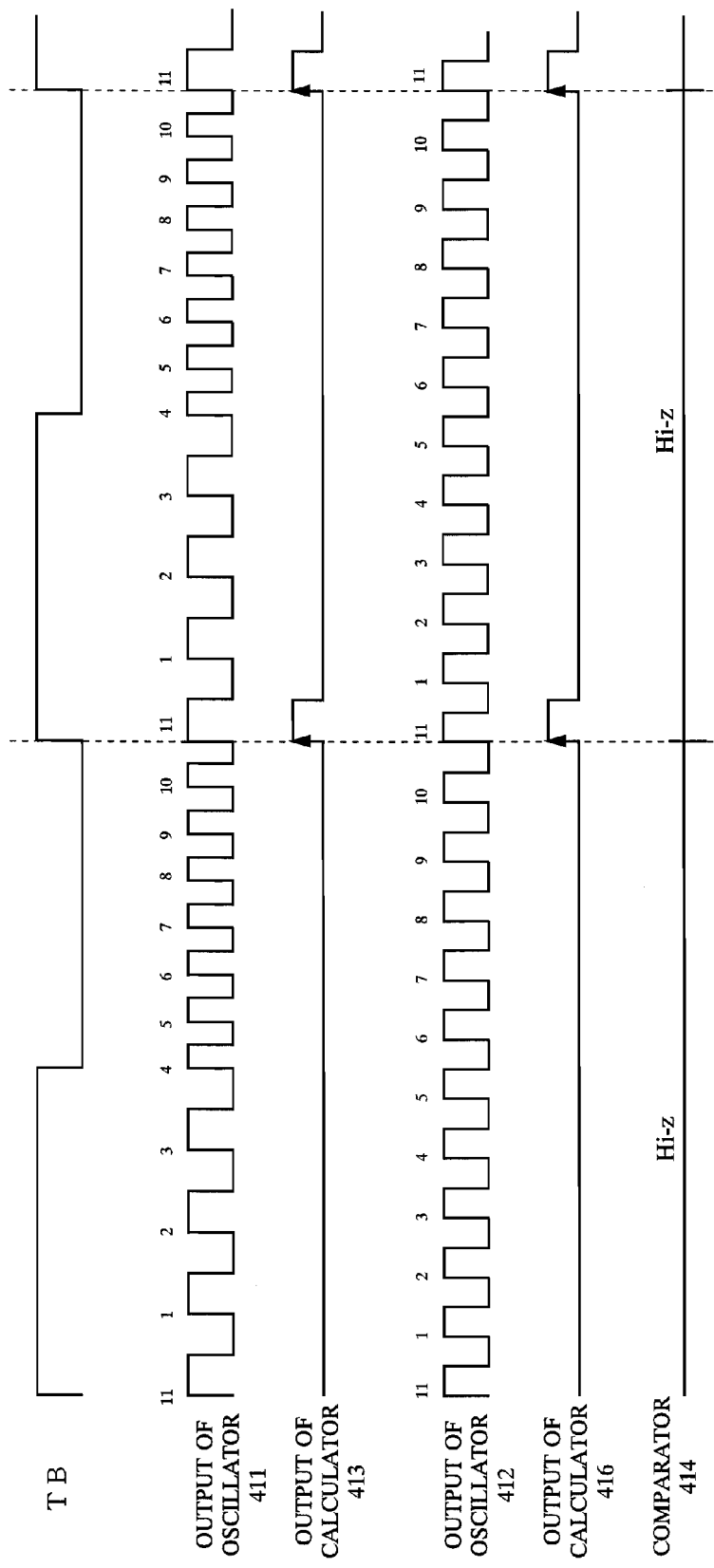

DIRECT MODULATION TYPE VOLTAGE-CONTROLLED OSCILLATOR USING MOS VARICAP

This application claims the benefit of provisional patent application Ser. No. 60/874,278 filed on Dec. 12, 2006.

BACKGROUND OF THE INVENTION

1. Field of the Invention

The present invention relates to a direct modulation type voltage-controlled oscillator using a MOS varicap, and more particularly to a voltage-controlled oscillator capable of performing a linear phase modulation.

2. Description of the Background Art

As is well known, a voltage-controlled oscillator (VCO) is widely used as a device for generating a local oscillation signal of a wireless communication device or the like. In particular, a direct modulation type voltage-controlled oscillator can perform a local oscillation process and a modulation process simultaneously. The direct modulation type voltage-controlled oscillator is disclosed in US Patent Publication No. 2005/0231296A1, for example.

FIG. 8 is a diagram illustrating an exemplary configuration of a conventional direct modulation type voltage-controlled oscillator 100. The conventional direct modulation type voltage-controlled oscillator 100 comprises inductors L111 and L112, a first variable capacitor section 110 for a carrier wave component, a second variable capacitor section 120 for a modulated wave component, transistors M111 and M112, and a current source I110. The inductors L111 and L112 are connected in series with each other so as to form an inductor circuit. The transistors M111 and M112 are cross-coupled to each other so as to form a negative resistance circuit. The first and second variable capacitor sections 110 and 120 are connected in parallel with the inductor circuit so as to form a parallel resonant circuit.

The first variable capacitor section 110 includes variable capacitors VC111 and VC112, each being composed of a MOS varicap, DC cut capacitors C111 and C112, and resistances R111 and R112. The variable capacitors VC111 and VC112 are connected in series with each other. The DC cut capacitors C111 and C112 are connected, respectively, to both ends of a series-connected circuit formed by the variable capacitors VC111 and VC112. A first reference voltage Vref1 is applied to a connection point of the variable capacitor VC111 and the variable capacitor VC112 as a DC bias. A control voltage VT1 corresponding to the carrier wave component is fed to a connection point of the variable capacitor VC111 and the DC cut capacitor C111 via the resistance R111 for blocking a high frequency. Furthermore, the control voltage VT1 is also fed to a connection point of the variable capacitor VC112 and the DC cut capacitor C112 via the resistance R112 for blocking the high frequency.

The second variable capacitor section 120 includes variable capacitors VC121 and VC122, each being composed of a MOS varicap, DC cut capacitors C121 and C122, and resistances R121 and R122. The variable capacitors VC121 and VC122 are connected in series with each other. The DC cut capacitors C121 and C122 are connected, respectively, to both ends of a series-connected circuit formed by the variable capacitors VC121 and VC122. A second reference voltage Vref2 is applied to a connection point of the variable capacitor VC121 and the variable capacitor VC122 as a DC bias. A control voltage VT2 corresponding to the modulated wave component is fed to a connection point of the variable capacitor VC121 and the DC cut capacitor C121 via the resistance R121 for blocking the high frequency. Furthermore, the control voltage VT2 is also fed to a connection point of the variable capacitor VC122 and the DC cut capacitor C122 via the resistance R122 for blocking the high frequency.

FIG. 9 is a diagram illustrating an example of a unit characteristic (shown by a solid line) of a MOS varicap used in the variable capacitor. FIG. 10 is a diagram illustrating an example of a gain characteristic of a voltage-controlled oscillator using a MOS varicap. Note that in each of FIGS. 9 and 10, a dashed line indicates an exemplary characteristic of a PN varicap.

As shown in FIG. 9, in a MOS varicap characteristic, there is an advantage that a range within which a capacity value of the MOS varicap varies is larger as compared to a PN varicap characteristic. In the MOS varicap characteristic, however, there is a drawback that a range within which the capacity value of the MOS varicap linearly varies with respect to a change in a potential difference across the MOS varicap is narrower as compared to the PN varicap characteristic. Therefore, as shown in FIG. 10, in the direct modulation type voltage-controlled oscillator using a variable capacitor as the MOS varicap, there is an advantage that the gain characteristic has a larger peak gain as compared to a direct modulation type voltage-controlled oscillator using a variable capacitor as the PN varicap. In the direct modulation type voltage-controlled oscillator using a variable capacitor as the MOS varicap, however, there is a drawback that an allowable range, of the potential difference across the MOS varicap, within which the peak gain can be obtained is narrower as compared to the direct modulation type voltage-controlled oscillator using a variable capacitor as the PN varicap. Therefore, it is desirable to always use the gain characteristic obtained when the potential difference across the MOS varicap is in the vicinity of zero.

However, the potential difference across the MOS varicap fluctuates due to component variations between the MOS varicaps, a temperature change of the voltage-controlled oscillator and the like. Particularly, in the conventional direct modulation type voltage-controlled oscillator 100 described above, an influence exerted on the second variable capacitor section 120 for controlling the modulated wave component cannot to be ignored. Thus, there is a problem that it is difficult to optimally perform the modulation process by always using the peak gain.

SUMMARY OF THE INVENTION

Therefore, an object of the present invention is to provide a direct modulation type voltage-controlled oscillator using a MOS varicap capable of optimally performing a modulation process by always using a peak gain without being influenced by component variations between MOS varicaps, a temperature change of the voltage-controlled oscillator and the like.

The present invention is directed to a direct modulation type voltage-controlled oscillator for oscillating a signal in which a carrier wave component is modulated by a modulated wave component. In order to attain the aforementioned object, the direct modulation type voltage-controlled oscillator of the present invention comprises: a first variable capacitor section including a variable capacitor whose capacitance value varies in accordance with a potential difference between a control voltage, corresponding to the carrier wave component, which is fed to one terminal and a first reference voltage applied to the other terminal; a second variable capacitor section including a variable capacitor whose capacitance value varies in accordance with a potential difference between a control voltage, corresponding to the modulated wave component, which is fed to one terminal and a second reference voltage applied to the other terminal; and a voltage setting section operable to set the control voltage corresponding to the modulated wave component based on the second reference voltage.

Typically, the variable capacitors included in the first and second variable capacitor sections are MOS varicaps.

It is preferable that the voltage setting section includes: a resistance operable to feed the second reference voltage to the one terminal of the second variable capacitor section; and a capacitor operable to pass only an AC component included in the modulated wave component so as to be inputted to the one terminal of the second variable capacitor section.

Alternatively, it is preferable that the voltage setting section includes: an offset circuit operable to detect an intermediate capacitance value in the second variable capacitor section and to generate, based on the second reference voltage, a third reference voltage corresponding to the intermediate capacitance value; a resistance operable to feed the third reference voltage to the one terminal of the second variable capacitor section; and a capacitor operable to pass only an AC component included in the modulated wave component so as to be inputted to the one terminal of the second variable capacitor section.

In the case of differentially inputting the modulated wave component, it is preferable that the voltage setting section includes: an offset circuit operable to detect an intermediate capacitance value in the second variable capacitor section and to generate, based on the second reference voltage, a third reference voltage corresponding to the intermediate capacitance value; and an operational amplifier circuit operable to feed the third reference voltage to a positive terminal and to differentially input the modulated wave component to the positive input terminal and a negative input terminal, and further to feed the third reference voltage, on which an AC component included in the modulated wave component is superimposed, to the one terminal of the second variable capacitor section.

In this case, the voltage setting section may further include a gain correction section operable to calculate a correction coefficient for canceling a gain fluctuation amount and to correct a value of the modulated wave component by using the correction coefficient.

According to the present invention, even when a variable capacitor being composed of a MOS varicap is used, a capacitance value of the variable capacitor can be controlled in the vicinity of the center of the MOS varicap characteristic which varies linearly, thereby making it possible to always use a peak gain of the gain characteristic of the voltage-controlled oscillator.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram illustrating a direct modulation type voltage-controlled oscillator 2 according to a second embodiment of the present invention;

FIG. 3B is a diagram describing examples of outputs of calculation counters 413 and 416 shown in FIG. 3A;

DESCRIPTION OF THE PREFERRED EMBODIMENTS

First Embodiment

Figure 1:
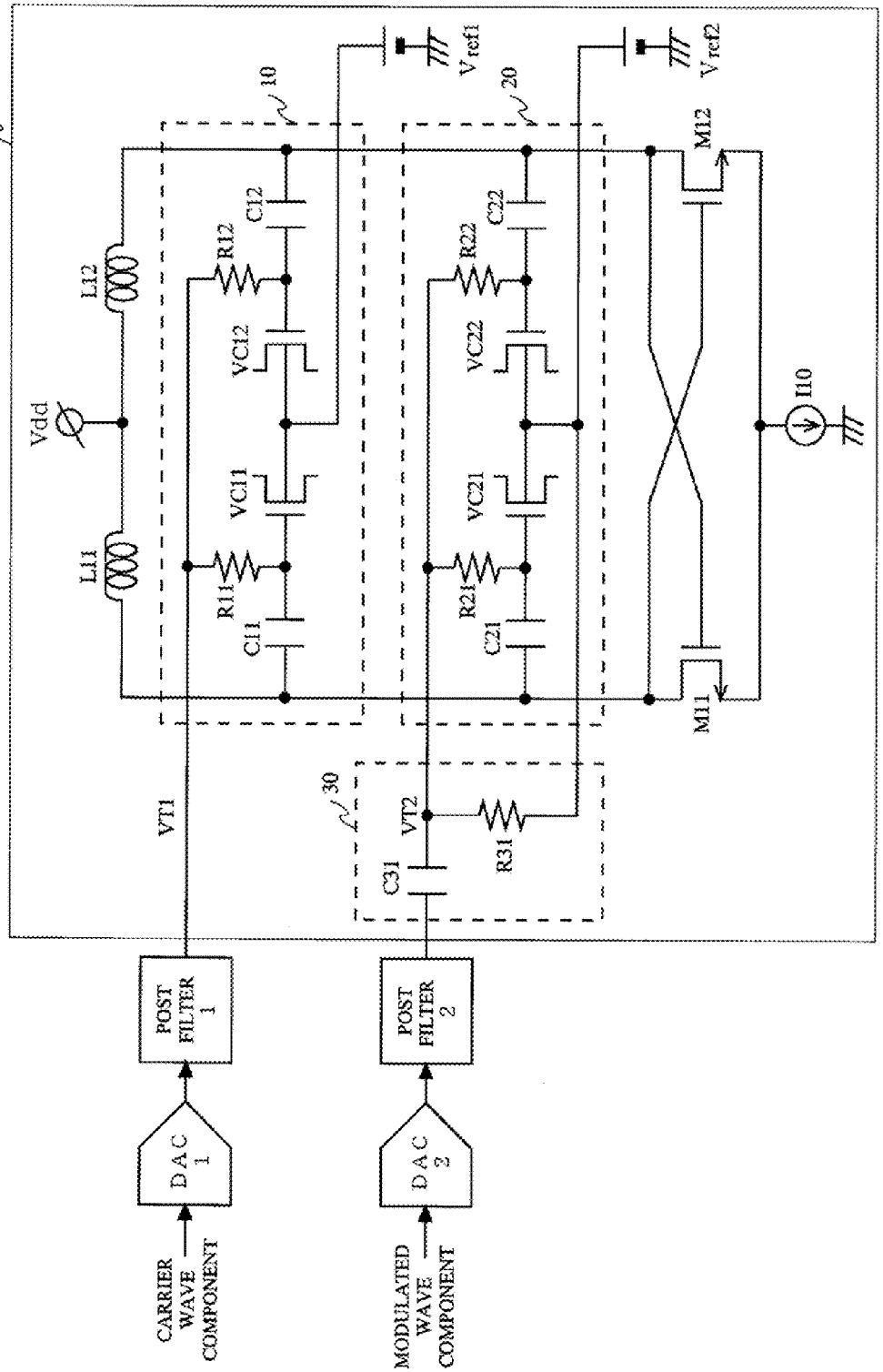
FIG. 1 is a circuit diagram illustrating a direct modulation type voltage-controlled oscillator 1 according to a first embodiment of the present invention.

FIG. 1 is a circuit diagram illustrating a direct modulation type voltage-controlled oscillator 1 according to a first embodiment of the present invention. In FIG. 1, the direct modulation type voltage-controlled oscillator 1 according to the first embodiment comprises inductors L11 and L12, a first variable capacitor section 10 for a carrier wave component, a second variable capacitor section 20 for a modulated wave component, a DC control section 30, transistors M11 and M12, and a current source I10. To the first variable capacitor section 10, the carrier wave component is inputted via a DAC 1 and a post filter 1. To the second variable capacitor section 20, the modulated wave component is inputted via a DAC 2, a post filter 2 and the DC control section 30. The inductors L11 and L12 are connected in series with each other so as to form an inductor circuit. The transistors M11 and M12 are cross-coupled to each other so as to form a negative resistance circuit. The first and second variable capacitor sections 10 and 20 are connected in parallel with the inductor circuit so as to form a parallel resonant circuit.

The first variable capacitor section 10 includes variable capacitors VC11 and VC12, each being composed of a MOS varicap, DC cut capacitors C11 and C12, and resistances R11 and R12. The variable capacitors VC11 and VC12 are connected in series with each other. The DC cut capacitors C11 and C12 are connected, respectively, to both ends of a series-connected circuit formed by the variable capacitors VC11 and VC12. A first reference voltage Vref1 is applied to a connection point of the variable capacitors VC11 and VC12 as a DC bias. A control voltage VT1 corresponding to the carrier wave component is fed from the post filter 1 to a connection point of the variable capacitor VC11 and the DC cut capacitor C11 via the resistance R11 for blocking a high frequency. Furthermore, the control voltage VT1 is also fed from the post filter 1 to a connection point of the variable capacitor VC12 and the DC cut capacitor C12 via the resistance R12 for blocking the high frequency.

The control voltage VT1 is a voltage, for example, in which the carrier wave component that is digital data is converted into an analog value by the DAC 1 and then aliasing noise is removed from the obtained data by the post filter 1. A value of the voltage is determined by a circuit configuration of the DAC 1.

The second variable capacitor section 20 includes variable capacitors VC21 and VC22, each being composed of a MOS varicap, DC cut capacitors C21 and C22, and resistances R21 and R22. The variable capacitors VC21 and VC22 are connected in series with each other. The DC cut capacitors C21 and C22 are connected, respectively, to both ends of a series-connected circuit formed by the variable capacitors VC21 and VC22. A second reference voltage Vref2 is applied to a connection point of the variable capacitors VC21 and VC22 as the DC bias. A control voltage VT2 corresponding to the modulated wave component is fed to a connection point of the variable capacitor VC21 and the DC cut capacitor C21 via the resistance R21 for blocking the high frequency. Furthermore, the control voltage VT2 is also fed to a connection point of the variable capacitor VC22 and the DC cut capacitor C22 via the resistance R22 for blocking the high frequency.

The DC control section 30 includes a resistance R31 and a capacitor C31. The resistance R31 is interposed between the second reference voltage Vref2 and a common connection point of the resistances R21 and R22. The capacitor C31 feeds only an AC component included in the modulated wave component to the common connection point of the resistances R21 and R22. Therefore, a DC voltage, on which the AC component included in the modulated wave component is superimposed, is changed from a DC bias outputted from the post filter 2 to the DC bias of the second reference voltage Vref2.

Figure 7:
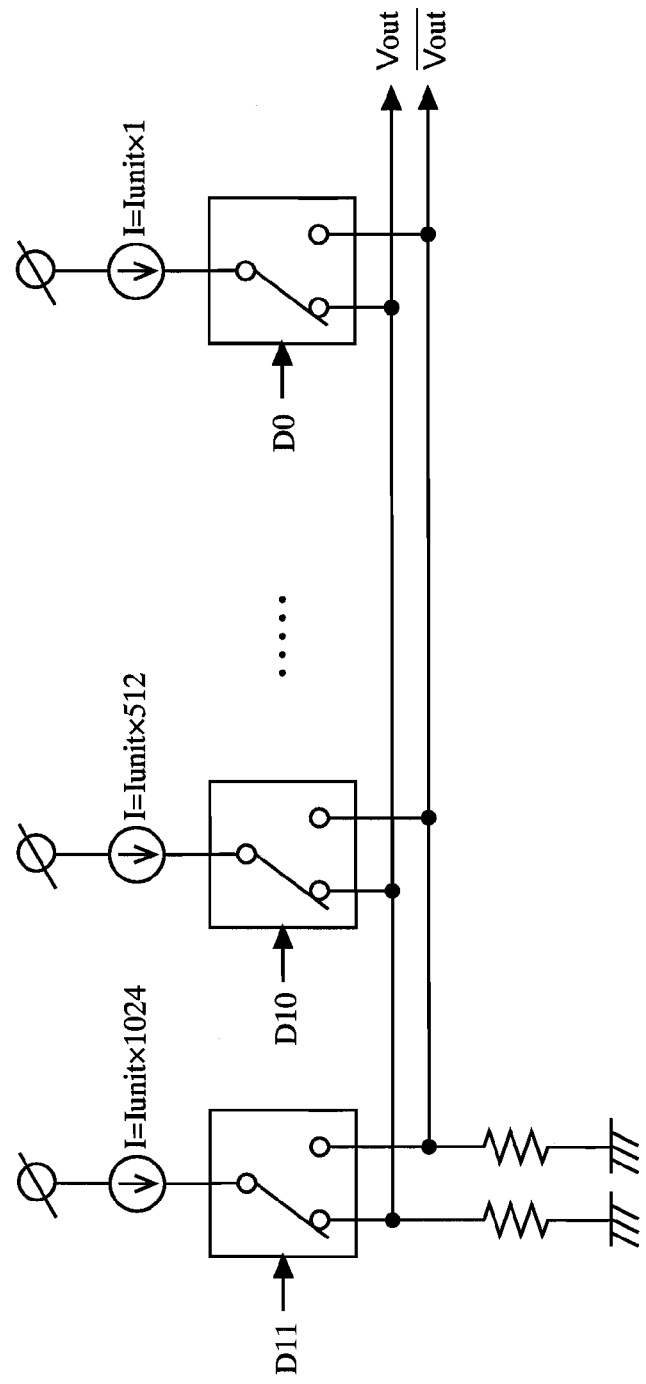
FIG. 7 is a diagram illustrating a detailed example of a circuit configuration of a DAC 2 to which digital data of 12 bits is inputted.
Figure 8:
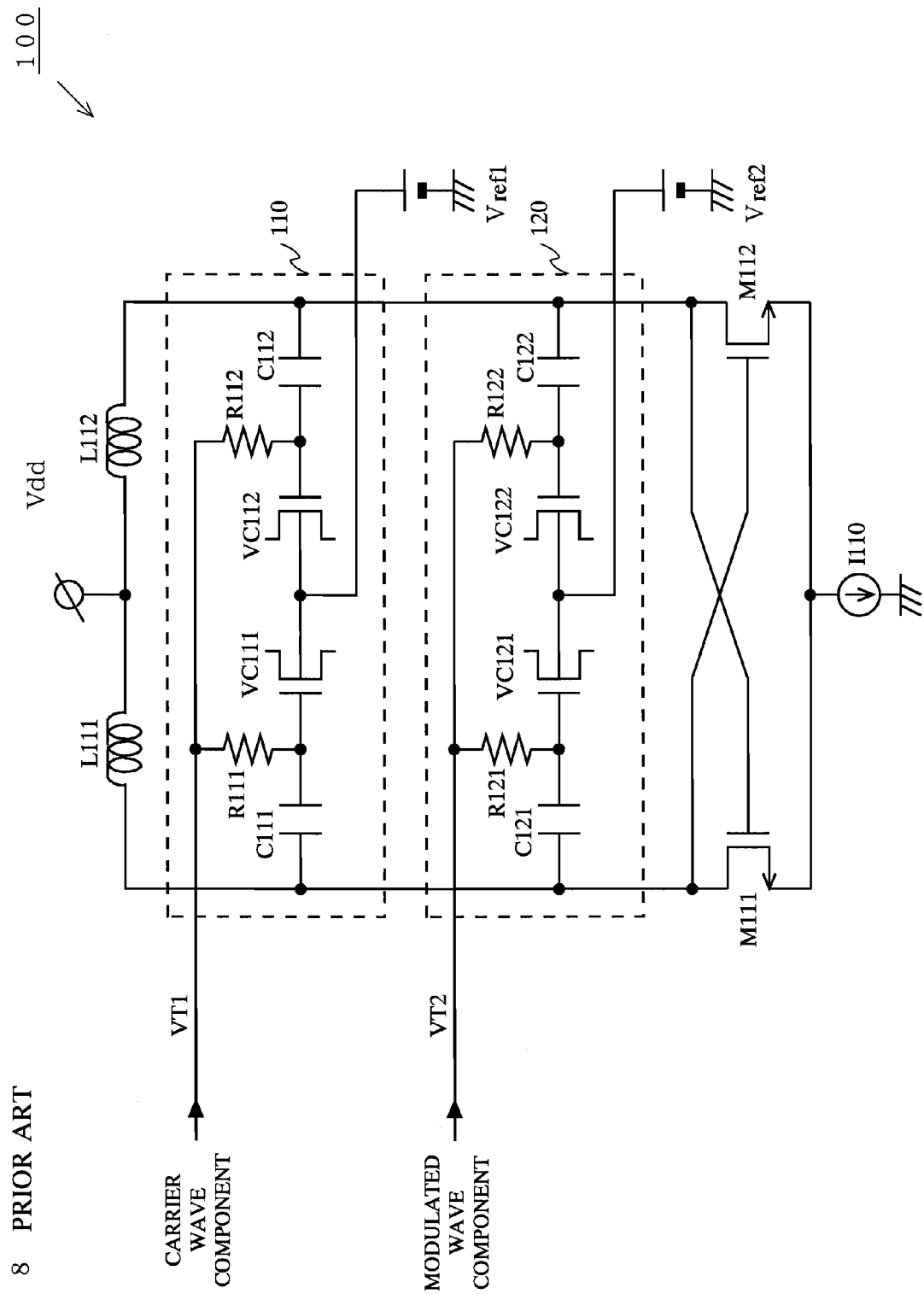
FIG. 8 is a circuit diagram illustrating a conventional direct modulation type voltage-controlled oscillator 100.
Figure 9:
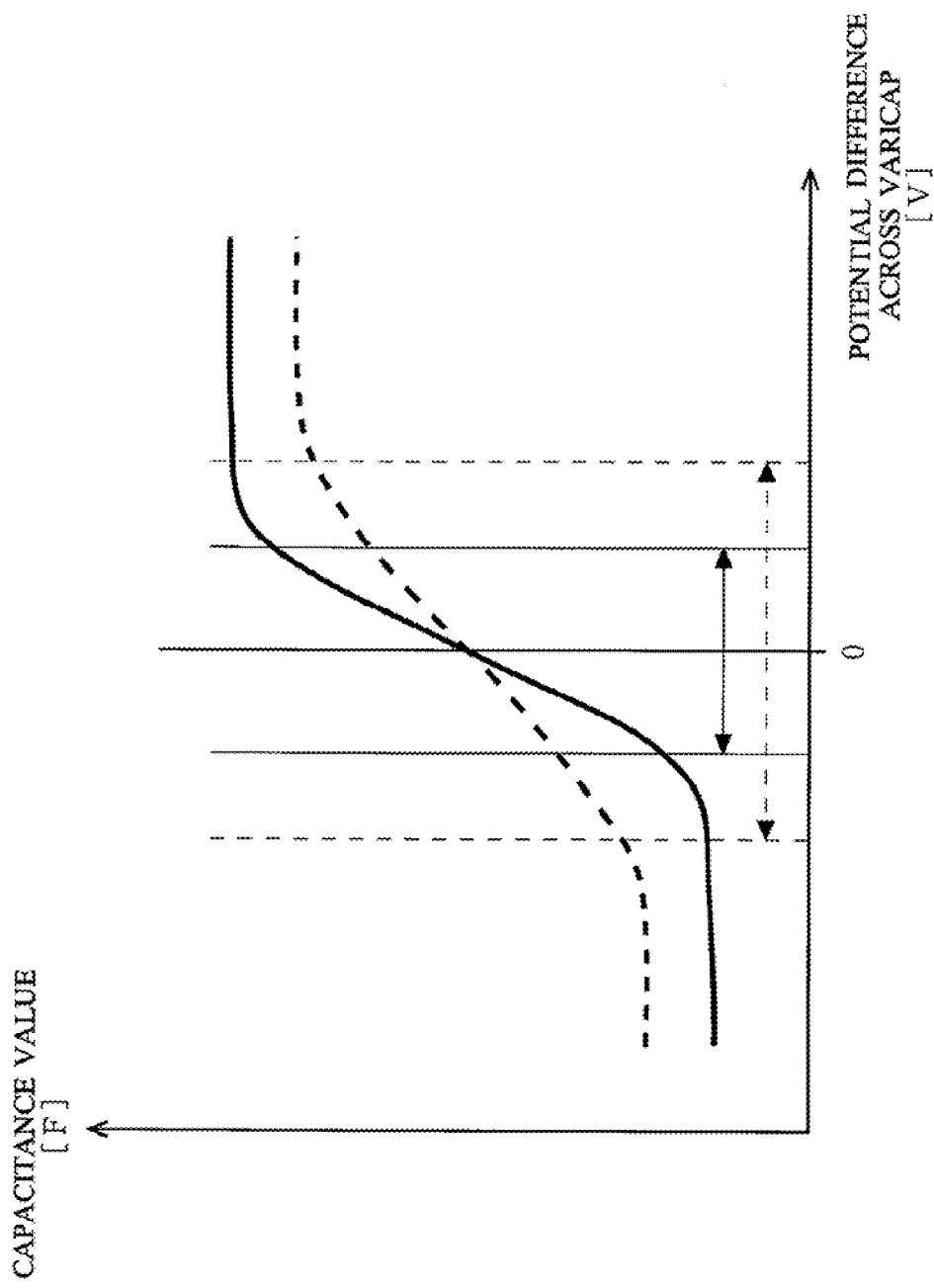
FIG. 9 is a diagram illustrating an example of a MOS varicap characteristic.
Figure 10:
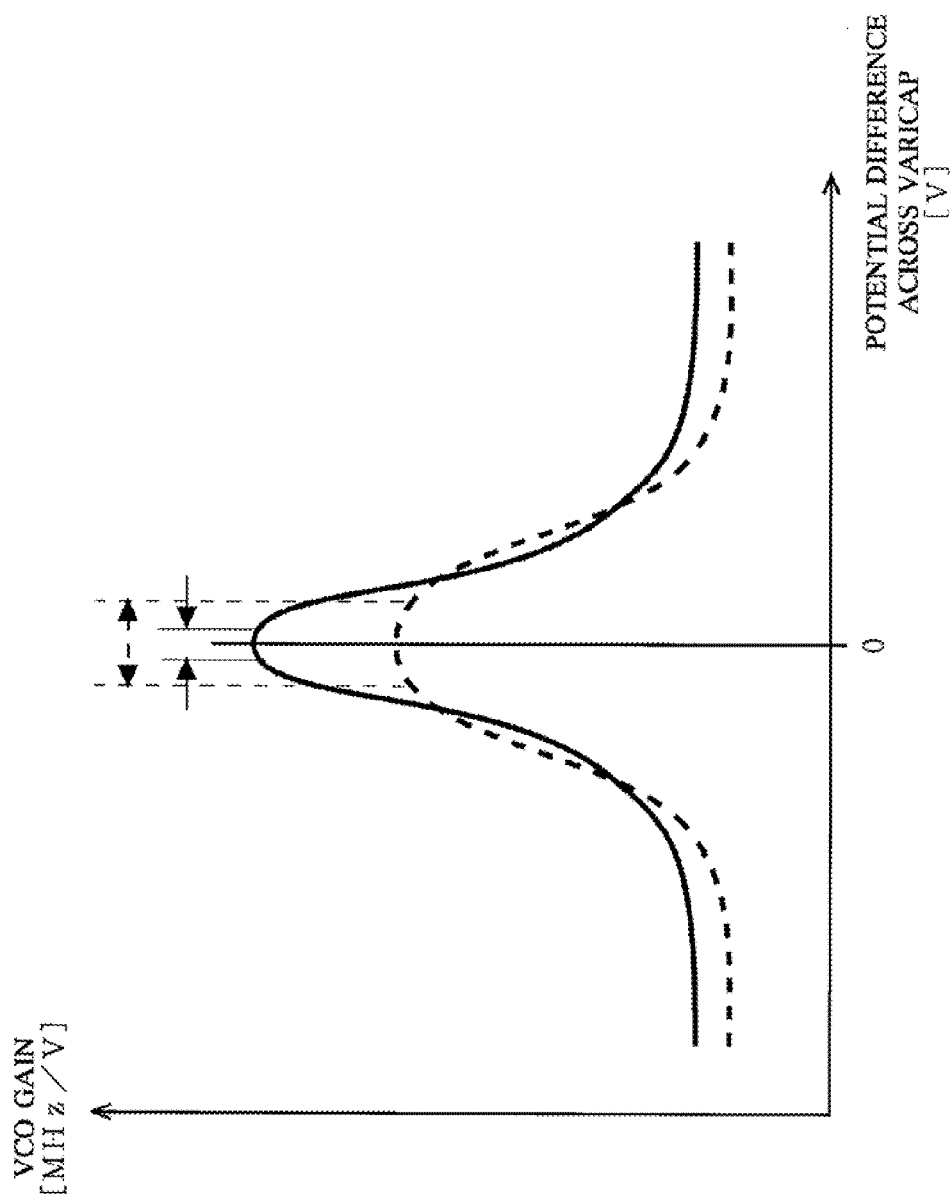
FIG. 10 is a diagram illustrating an example of a gain characteristic of a voltage-controlled oscillator using a MOS varicap.

The DC bias outputted from the post filter 2 is a voltage, for example, in which the modulated wave component that is digital data is converted into an analog value by the DAC 2 and then the aliasing noise is removed from the obtained data by the post filter 2. A value of the voltage is determined by a circuit configuration of the DAC 2. FIG. 7 is a diagram illustrating a detailed example of the configuration of the DAC 2 to which the digital data of 12 bits is inputted.

Furthermore, in order to obtain an all-pass transfer characteristic by combining a transfer characteristic, of the first variable capacitor section 10, which is represented by a LPF function and a transfer characteristic, of the second variable capacitor section 20, which is represented by an HPF function, it is desirable that the resistance R31 and the capacitor C31 are set at values as large as possible, and a cutoff frequency (f=1/(2n×C31×R31)) is also set at a substantially low value. Note that the technique of the all-pass transfer characteristic is disclosed in a paper "SIMPLE POLAR-LOOP TRANSMITTER FOR DUAL-MODE BLUETOOTH" issued by IEEE in 2005.

With such a configuration, a potential difference between the second reference voltage Vref2 and an average DC voltage, of the modulated wave component, which is fed to the variable capacitor VC21 becomes substantially zero. Similarly, a potential difference between the second reference voltage Vref2 and the average DC voltage which is fed to the variable capacitor VC22 also becomes substantially zero. Therefore, a capacitance value of each of the variable capacitors VC21 and VC22, acting as the MOS varicaps, can be controlled in the vicinity of the center of a characteristic which varies linearly, thereby allowing the direct modulation type voltage-controlled oscillator 1 to always use a peak gain of a gain characteristic.

Second Embodiment

FIG. 2 is a circuit diagram of a direct modulation type voltage-controlled oscillator 2 according to a second embodiment of the present invention. In FIG. 2, the direct modulation type voltage-controlled oscillator 2 according to the second embodiment comprises the inductors L11 and L12, the first variable capacitor section 10 for the carrier wave component, the second variable capacitor section 20 for the modulated wave component, a DC control section 40, the transistors M11 and M12, and the current source I10. To the first variable capacitor section 10, the carrier wave component is inputted via the DAC 1 and the post filter 1. To the second variable capacitor section 20, the modulated wave component is inputted via the DAC 2, the post filter 2 and the DC control section 40. The direct modulation type voltage-controlled oscillator 2 is the same as the direct modulation type voltage-controlled oscillator 1 except that a configuration of the DC control section 40 included in the direct modulation type voltage-controlled oscillator 2 is different from that of the DC control section 30 included in the direct modulation type voltage-controlled oscillator 1. Hereinafter, the second embodiment will be described mainly with respect to this difference. In the second embodiment, the same components as those of the first embodiment will be denoted by the same reference numerals and will not be further described below.

The DC control section 40 includes the resistance R31, the capacitor R31 and an offset circuit 41. The offset circuit 41 calculates, based on the second reference voltage Vref2, a voltage having an intermediate capacitance value in a range within which the capacitance value of each of the variable capacitors VC21 and VC22 varies, and outputs the obtained voltage as a third reference voltage Voff. The resistance R31 is interposed between the third reference voltage Voff and the common connection point of the resistances R21 and R22. The capacitor C31 feeds only the AC component included in the modulated wave component to the common connection point of the resistances R21 and R22. Therefore, a DC voltage, on which the AC component included in the modulated wave component is superimposed, is changed from the DC bias outputted from the post filter 2 to a DC bias of the third reference voltage Voff.

Figure 3A:
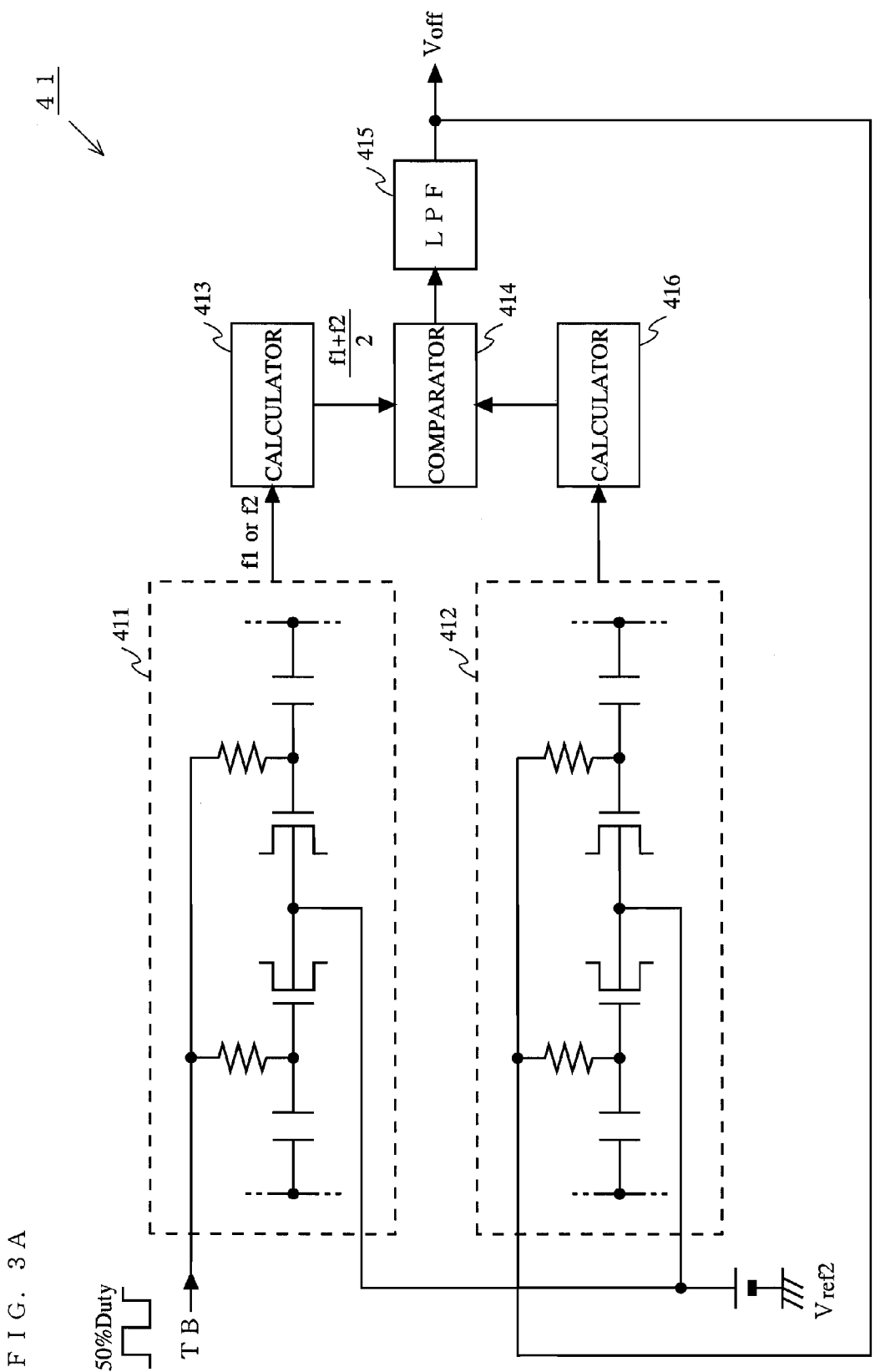
FIG. 3A is a diagram illustrating an example of a detailed configuration of an offset circuit 41 shown in FIG. 2.

It is desirable that the offset circuit 41 has low frequency multi-vibrator oscillators 411 and 412, calculation counters 413 and 416, a comparator 414, and a low-pass filter (LPF) 415, as shown in FIG. 3A, for example. Each of the low frequency multi-vibrator oscillators 411 and 412 is formed by using a dummy component similar to that used in the second variable capacitor section 20.

To the low frequency multi-vibrator oscillator 411, inputted is a square wave signal (TB) in which a voltage obtained when the capacitance value of each of the variable capacitors VC21 and VC22 is a maximum capacitance value and a voltage obtained when the capacitance value of each of the variable capacitors VC21 and VC22 is a minimum capacitance value are alternately switched between each other at a duty ratio of 50%. Thus, a signal having a frequency f1 oscillated in accordance with the maximum capacitance value and a signal having a frequency f2 oscillated in accordance with the minimum capacitance value are alternately outputted from the low frequency multi-vibrator oscillator 411. The calculation counter 413, to which the two signals having the frequency f1 and the frequency f2 are inputted, obtains a signal having a frequency (f1+f2)/n, which is divided by n. The frequency (f1+f2)/n corresponds to a frequency obtained when the capacitance value of each of the variable capacitors VC21 and VC22 is the intermediate capacitance value.

On the other hand, to the low frequency multi-vibrator oscillator 412, the third reference voltage Voff outputted from the offset circuit 41 is fed back. Therefore, a signal having a frequency oscillated in accordance with a controlled capacitance value is outputted from the low frequency multi-vibrator oscillator 412. The calculation counter 416 divides the frequency of the signal outputted from the low frequency multi-vibrator oscillator 412 by n, so as to be outputted to the comparator 414.

The comparator 414 compares the signal having the frequency (f1+f2)/n outputted from the calculation counter 413 with the signal having a frequency outputted from the calculation counter 416, thereby outputting a differential signal indicating a frequency difference therebetween. The low-pass filter 415 smoothes the differential signal outputted from the comparator 414 so as to be converted into the third reference voltage Voff (a DC voltage). FIG. 3B is a diagram describing examples of outputs of the calculation counters 413 and 416 in the case where a dividing ratio satisfies n=11 and a three-state PFD is used for the comparator 414. As shown in FIG. 3B, the outputs become high impedance (Hi-z) when phases of the frequencies of the two signals coincide with each other.

With such a configuration, the third reference voltage Voff corresponding to the intermediate capacitance value outputted from the low frequency multi-vibrator oscillator 411 can be outputted. Therefore, even if component variations, environmental temperature changes and the like occur, the capacitance value of each of the variable capacitors VC21 and VC22 can be controlled in the vicinity of the center of the characteristic which varies linearly, thereby allowing the direct modulation type voltage-controlled oscillator 2 to always use the peak gain of the gain characteristic.

Third Embodiment

Figure 4:
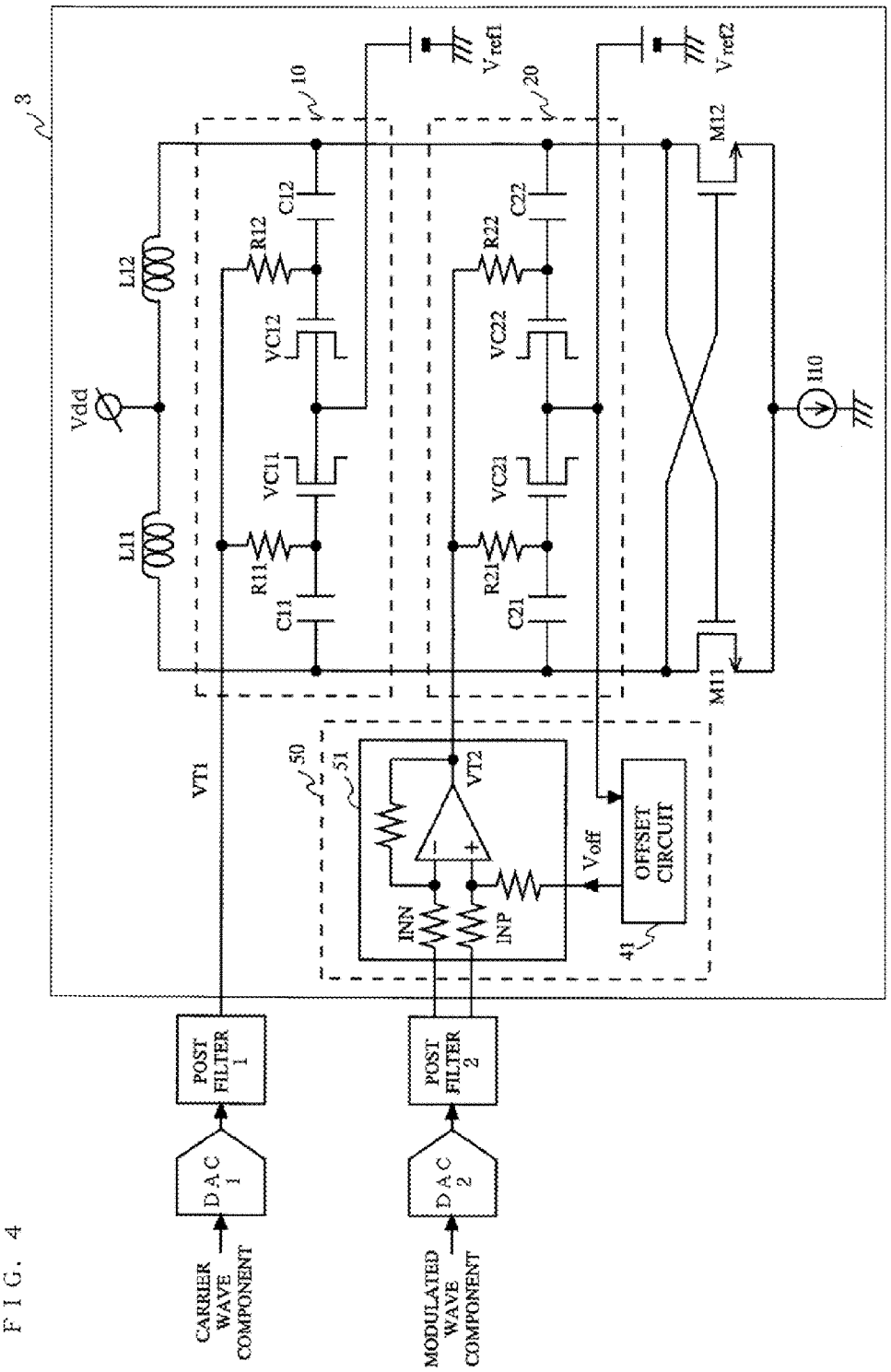
FIG. 4 is a circuit diagram illustrating a direct modulation type voltage-controlled oscillator 3 according to a third embodiment of the present invention.

FIG. 4 is a circuit diagram of a direct modulation type voltage-controlled oscillator 3 according to a third embodiment of the present invention. In FIG. 4, the direct modulation type voltage-controlled oscillator 3 according to the third embodiment comprises the inductors L11 and L12, the first variable capacitor section 10 for the carrier wave component, the second variable capacitor section 20 for the modulated wave component, a DC control section 50, the transistors M11 and M12, and the current source I10. To the first variable capacitor section 10, the carrier wave component is inputted via the DAC 1 and the post filter 1. To the second variable capacitor section 20, the modulated wave component is inputted via the DAC 2, the post filter 2 and the DC control section 50. The direct modulation type voltage-controlled oscillator 3 is the same as the direct modulation type voltage-controlled oscillator 2 except that a configuration of the DC control section 50 included in the direct modulation type voltage-controlled oscillator 3 is different from that of the DC control section 40 included in the direct modulation type voltage-controlled oscillator 2. Hereinafter, the third embodiment will be described mainly with respect to this difference. In the third embodiment, the same components as those of the second embodiment will be denoted by the same reference numerals and will not be further described below.

The DC control section 50 includes the offset circuit 41 and an operational amplifier circuit 51. The offset circuit 41 calculates, based on the second reference voltage Vref2, the voltage having the intermediate capacitance value in the range within which the capacitance value of each of the variable capacitors VC21 and VC22 varies, and outputs the obtained voltage as the third reference voltage Voff. The operational amplifier circuit 51, to which the modulated wave component and the third reference voltage Voff are fed, executes a process of changing a DC voltage, on which only the AC component included in the modulated wave component is superimposed, to the third reference voltage Voff. Specifically, the operation amplifier circuit 51, to which a signal INN and a signal INP both of which are differentially outputted from the post filter 2 are inputted, applies the third reference voltage Voff to an inputted DC component which is caused to be 0V through a process in which the signal INN is subtracted from the signal INP (VT2=INP−INN+Voff).

With such a configuration, the capacitor (C31) for cutting the DC component included in the modulated wave component can be eliminated. Therefore, even when a PLL frequency band of the voltage-controlled oscillator is narrow (i.e., when a C/N ratio is high in case of transmission), a frequency modulation can be performed from a low frequency. Furthermore, in the case where the direct modulation type voltage-controlled oscillator 3 is mounted on a semiconductor chip, a size of the semiconductor chip can be reduced.

Fourth Embodiment

Figure 5:
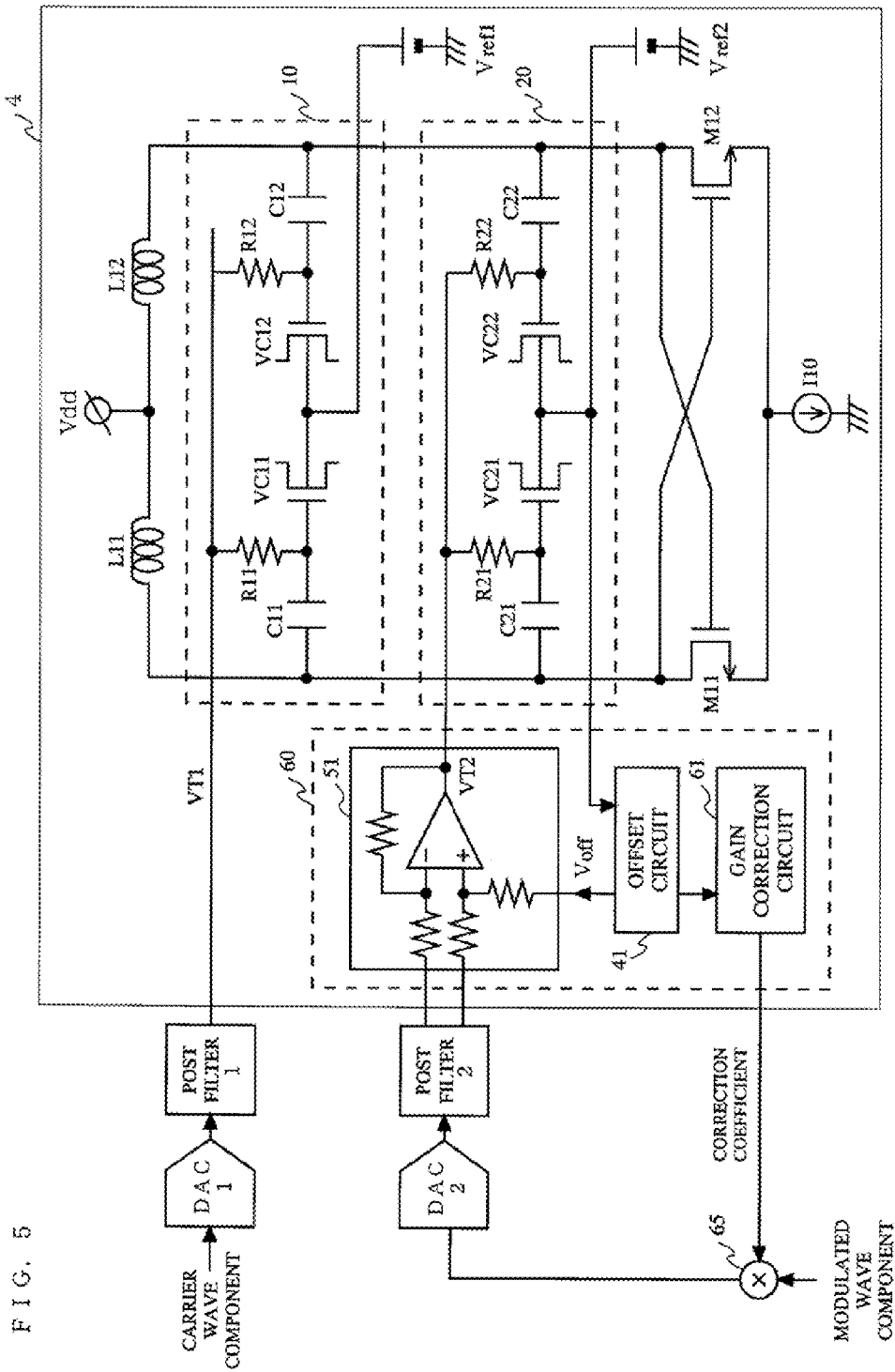
FIG. 5 is a circuit diagram illustrating a direct modulation type voltage-controlled oscillator 4 according to a fourth embodiment of the present invention.

FIG. 5 is a circuit diagram illustrating a direct modulation type voltage-controlled oscillator 4 according to a fourth embodiment of the present invention. In FIG. 5, the direct modulation type voltage-controlled oscillator 4 according to the fourth embodiment comprises the inductors L11 and L12, the first variable capacitor section 10 for the carrier wave component, the second variable capacitor section 20 for the modulated wave component, a DC control section 60, the transistors M11 and M12, and the current source I10. To the first variable capacitor section 10, the carrier wave component is inputted via the DAC 1 and the post filter 1. To the second variable capacitor section 20, the modulated wave component is inputted via the DAC 2, the post filter 2 and the DC control section 60. The direct modulation type voltage-controlled oscillator 4 is the same as the direct modulation type voltage-controlled oscillator 3 except that a configuration of the DC control section 60 included in the direct modulation type voltage-controlled oscillator 4 is different from that of the DC control section 50 included in the direct modulation type voltage-controlled oscillator 3. Hereinafter, the fourth embodiment will be described mainly with respect to this difference. In the fourth embodiment, the same components as those of the third embodiment will be denoted by the same reference numerals and will not be further described below.

Figure 6:
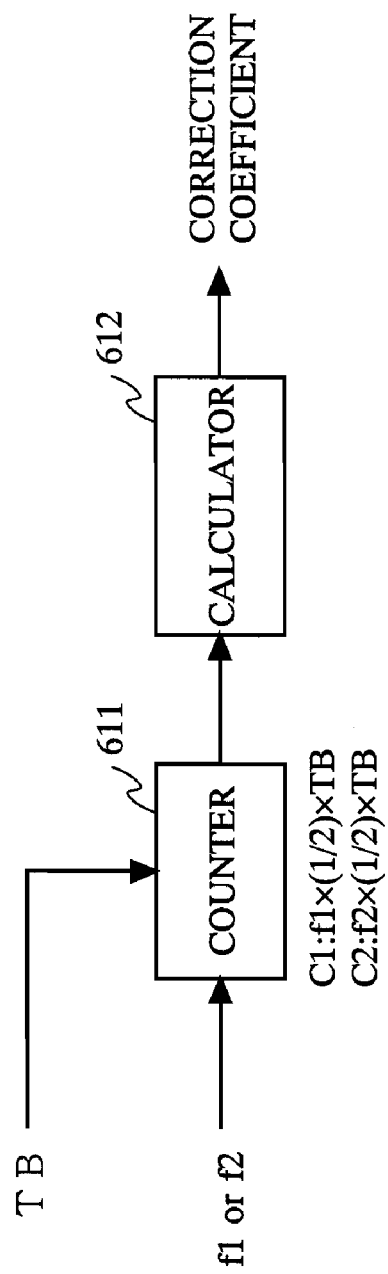
FIG. 6 is a diagram illustrating an example of a detailed configuration of a gain correction circuit 61 shown in FIG. 5.

The DC control section 60 includes the offset circuit 41, the operational amplifier circuit 51 and a gain correction circuit 61. The gain correction circuit 61 is used for correcting gain variations produced by the voltage-controlled oscillator, and has a counter 611 and a calculator 612, as shown in FIG. 6, for example.

To the counter 611, the square wave signal (TB) and the two signals having the frequency f1 and the frequency f2 outputted from the low frequency multi-vibrator oscillator 411 included in the offset circuit 41 are inputted. Then, the counter 611 counts a time period during which the signal having the frequency f1 is inputted and stores the time period as a count value c1. Also, the counter 611 counts another time period during which the signal having the frequency f2 is inputted and stores the said another time period as a count value c2. The count values c1 and c2 are reset each time the two signals are switched between each other.

Each time the count values c1 and c2 are newly stored, the calculator 612 calculates a value new(c1-c2) by subtracting the count value c2 from the count value c1. Thereafter, the calculator 612 calculates a value by dividing a previously calculated value old(c1-c2) by a newly calculated value new (c1-c2) as a correction coefficient [old(c1-c2)/new(c1-c2)]. The correction coefficient is "1" if a gain of the voltage-controlled oscillator does not fluctuate. Also, the correction coefficient becomes larger if the gain is decreased, and smaller if the gain is increased. Thus, the correction coefficient is multiplied by the modulated wave component via a multiplier 65 so as to cause the control voltage VT2 to be decreased or increased in accordance with up-and-down fluctuations in gain, thereby making it possible to correct the gain.

With such a configuration, the correction coefficient corresponding to the intermediate capacitance value outputted from the low frequency multi-vibrator oscillator 411 can be outputted. Therefore, it becomes possible to cancel gain fluctuations, of the voltage-controlled oscillator, which may be caused by the component variations, the environmental temperature changes and the like.

As described above, in the direct modulation type voltage-controlled oscillators according to the respective embodiments of the present invention, even when a variable capacitor composed of a MOS varicap is used, a capacitance value thereof can be controlled in the vicinity of the center of a MOS varicap characteristic which varies linearly and the voltage-controlled oscillators can always use a peak gain of a gain characteristic.

While the invention has been described in detail, the foregoing description is in all aspects illustrative and not restrictive. It is understood that numerous other modifications and variations can be devised without departing from the scope of the invention.

What is claimed is:

1. A direct modulation type voltage-controlled oscillator for oscillating a signal in which a carrier wave component is modulated by a modulated wave component, the direct modulation type voltage-controlled oscillator comprising:
    a first variable capacitor section having a first terminal and a second terminal, the first variable capacitor section including a variable capacitor whose capacitance value varies in accordance with a potential difference between a control voltage, corresponding to the carrier wave component, which is fed to the first terminal and a first reference voltage applied to the second terminal;
    a second variable capacitor section having a first terminal and a second terminal, the second variable capacitor section including a variable capacitor whose capacitance value varies in accordance with a potential difference between a control voltage, corresponding to the modulated wave component, which is fed to the first terminal and a second reference voltage applied to the second terminal; and
    a voltage setting section operable to set the control voltage corresponding to the modulated wave component based on the second reference voltage,
    wherein the voltage setting section includes:
        an offset circuit operable to detect an intermediate capacitance value in the second variable capacitor section and to generate, based on the second reference voltage, a third reference voltage corresponding to the intermediate capacitance value;
        a resistance located between the offset circuit and the first terminal of the second variable capacitor section, the third reference voltage passing through the resistance prior to being received at the first terminal of the second variable capacitor section; and
        a capacitor located before the first terminal of the second variable capacitor section, the capacitor being operable to pass only an AC component included in the modulated wave component to the first terminal of the second variable capacitor section.

2. The direct modulation type voltage-controlled oscillator according to claim 1, wherein
    the variable capacitors included in the first and second variable capacitor sections are MOS varicaps.

3. A direct modulation type voltage-controlled oscillator for oscillating a signal in which a carrier wave component is modulated by a modulated wave component, the direct modulation type voltage-controlled oscillator comprising:
    a first variable capacitor section having a first terminal and a second terminal, the first variable capacitor section including a variable capacitor whose capacitance value varies in accordance with a potential difference between a control voltage, corresponding to the carrier wave component, which is fed to the first terminal and a first reference voltage applied to the second terminal;
    a second variable capacitor section having a first terminal and a second terminal, the second variable capacitor section including a variable capacitor whose capacitance value varies in accordance with a potential difference between a control voltage, corresponding to the modulated wave component, which is fed to the first terminal and a second reference voltage applied to the second terminal; and
    a voltage setting section operable to set the control voltage corresponding to the modulated wave component which is differentially inputted, based on the second reference voltage.

4. The direct modulation type voltage-controlled oscillator according to claim 3, wherein
    the voltage setting section includes:
        an offset circuit operable to detect an intermediate capacitance value in the second variable capacitor section and to generate, based on the second reference voltage, a third reference voltage corresponding to the intermediate capacitance value; and
        an operational amplifier circuit having a positive terminal and a negative terminal, the positive terminal receiving the third reference voltage and the positive terminal and the negative terminal differentially receiving the modulated wave component, the operational amplifier circuit being operable to feed the third reference voltage, on which an AC component included in the modulated wave component is superimposed, to the first terminal of the second variable capacitor section.

5. The direct modulation type voltage-controlled oscillator according to claim 4, wherein
    the voltage setting section further includes a gain correction section operable to calculate a correction coefficient for canceling a gain fluctuation amount and to correct a value of the modulated wave component by using the correction coefficient.

6. The direct modulation type voltage-controlled oscillator according to claim 3, wherein
    the variable capacitors included in the first and second variable capacitor sections are MOS varicaps.

* * * * *